United States Patent
Wang et al.

(10) Patent No.: US 9,870,811 B2
(45) Date of Patent: Jan. 16, 2018

(54) PHYSICALLY UNCLONABLE FUNCTION BASED ON COMPARISON OF MTJ RESISTANCES

(71) Applicant: QUALCOMM Incorporated, San Diego, CA (US)

(72) Inventors: Peiyuan Wang, San Diego, CA (US); Jung Pill Kim, San Diego, CA (US); Jimmy Jianan Kan, San Diego, CA (US); Chando Park, Irvine, CA (US); Seung Kang, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 0 days.

(21) Appl. No.: 15/185,441

(22) Filed: Jun. 17, 2016

(65) Prior Publication Data
US 2017/0365316 A1    Dec. 21, 2017

(51) Int. Cl.
*G11C 11/16* (2006.01)
*G11C 17/02* (2006.01)

(52) U.S. Cl.
CPC ........ *G11C 11/1675* (2013.01); *G11C 11/161* (2013.01)

(58) Field of Classification Search
CPC ... G11C 17/02; G11C 11/1673; G11C 11/161; G11C 11/1675; G11C 11/1695; G11C 11/1659; G11C 11/165
See application file for complete search history.

(56) References Cited

U.S. PATENT DOCUMENTS

| | | | |
|---|---|---|---|
| 8,502,091 B2 * | 8/2013 | Palmer | A61B 17/00234 200/1 B |
| 9,275,714 B1 * | 3/2016 | Kim | G11C 11/1673 |
| 2010/0302832 A1 * | 12/2010 | Berger | G11C 8/04 365/80 |

(Continued)

FOREIGN PATENT DOCUMENTS

| WO | 2015134037 A1 | 9/2015 |
|---|---|---|
| WO | 2016018503 A1 | 2/2016 |

OTHER PUBLICATIONS

Jang J-W., et al., "Design and Analysis of Novel SRAM PUFs with Embedded Latch for Robustness," 16th Int'l Symposium on Quality Electronic Design, 2015, pp. 298-302.

(Continued)

*Primary Examiner* — Hien Nguyen
(74) *Attorney, Agent, or Firm* — Toler Law Group, PC.

(57) ABSTRACT

In a particular aspect, an apparatus includes a magnetic random access memory (MRAM) cell including a pair of cross coupled inverters including a first inverter and a second inverter. The first inverter includes a first transistor coupled to a first node and a second transistor coupled to the first node. The second inverter includes a third transistor coupled to a second node and a fourth transistor coupled to the second node. The MRAM cell includes a first magnetic tunnel junction (MTJ) element coupled to the second transistor and a second MTJ element coupled to the fourth transistor. The apparatus further includes a voltage initialization circuit coupled to the MRAM cell. The voltage initialization circuit is configured to substantially equalize voltages of the first node and the second node in response to an initialization signal.

15 Claims, 6 Drawing Sheets

(56) References Cited

U.S. PATENT DOCUMENTS

2015/0071432 A1    3/2015  Zhu et al.
2016/0093353 A1*   3/2016  Jung .................. G11C 11/1673
                                                      365/158

OTHER PUBLICATIONS

Vatajelu E.I., et al., "STT-MRAM-Based Strong PUF Architecture," IEEE Computer Society Annual Symposium on VLSI, 2015, pp. 467-472.

* cited by examiner

PHYSICALLY UNCLONABLE FUNCTION BASED ON COMPARISON OF MTJ RESISTANCES

I. FIELD

The present disclosure is generally related to devices and methods that generate a physically unclonable function based on a comparison of magnetic tunnel junction (MTJ) resistances.

II. DESCRIPTION OF RELATED ART

Advances in technology have resulted in smaller and more powerful computing devices. For example, a variety of portable personal computing devices, including wireless telephones such as mobile and smart phones, tablets and laptop computers are small, lightweight, and easily carried by users. These devices can communicate voice and data packets over wireless networks. Further, many such devices incorporate additional functionality such as a digital still camera, a digital video camera, a digital recorder, and an audio file player. Also, such devices can process executable instructions, including software applications, such as a web browser application, that can be used to access the Internet. As such, these devices can include significant computing and networking capabilities.

A physically unclonable function (PUF) of a device generates unique, random information based on underlying physical characteristics of the device. The information generated by the PUF may be used to authenticate the device or may be used as a cryptographic key. For example, a mobile device may include circuitry that is configured to generate a PUF output for use as a basis for a device identifier of the mobile device. The device identifier may be used as part of an authentication process with a server that is programmed with the device identifier.

One technique for generating a PUF for a spin-torque transfer magnetic random access memory (STT-MRAM) is to generate information based on a difference in resistance between two pairs of magnetic tunnel junction (MTJ) elements in different magnetic random access memory (MRAM) cells. In order to compare the resistance between the two pairs of MTJ elements, MTJ elements from different MRAM cells are selected. A PUF output bit is determined based on the comparison of the resistances of the MTJ elements from the different MRAM cells. However, differences in various metal lines (e.g., bit lines, word lines, etc.) and sense amplifier mismatch may bias the PUF output and cause the PUF output bit to more likely be a particular value (e.g., a one value or a zero value) instead of a random value based on the resistance difference between MTJ elements from the different MRAM cells. Reducing the randomness of the PUF output may reduce the security provided by the PUF output.

III. SUMMARY

In a particular aspect, an apparatus includes a magnetic random access memory (MRAM) cell including a pair of cross coupled inverters including a first inverter and a second inverter. The first inverter includes a first transistor coupled to a first node and a second transistor coupled to the first node. The second inverter includes a third transistor coupled to a second node and a fourth transistor coupled to the second node. The MRAM cell includes a first magnetic tunnel junction (MTJ) element coupled to the second transistor and a second MTJ element coupled to the fourth transistor. The apparatus further includes a voltage initialization circuit coupled to the MRAM cell. The voltage initialization circuit is configured to substantially equalize voltages of the first node and the second node in response to an initialization signal.

In a particular aspect, a method includes initializing voltages of a first node and a second node of a magnetic random access memory (MRAM) cell to a substantially equal voltage during an initialization phase. The MRAM cell includes a pair of cross-coupled inverters, a first magnetic tunnel junction (MTJ) element, and a second MTJ element. A first inverter of the pair of cross-coupled inverters includes a first transistor coupled to the first node and a second transistor coupled to the first node and to the first MTJ element, and a second inverter of the pair of cross-coupled inverters includes a third transistor coupled to the second node and a fourth transistor coupled to the second node and to the second MTJ element. The method further includes storing a physically unclonable function (PUF) output bit at the MRAM cell during a PUF content generation phase.

In a particular aspect, an apparatus includes means for means for generating a physical unclonable function (PUF) output bit based on a resistance comparison. The means for generating the PUF output bit include first means for inverting cross-coupled to second means for inverting, first resistive means coupled to the first means for inverting, and second resistive means coupled to the second means for inverting. The first means for inverting have an output at a first node and the second means for inverting have an output at a second node. The apparatus further includes means for equalizing voltages of the first node and the second node in response to an initialization signal. The means for equalizing is coupled to the means for generating the PUF output bit.

In a particular aspect, a non-transitory computer readable medium stores instructions that, when executed by a processor, cause the processor to initialize voltages of a first node and a second node of a magnetic random access memory (MRAM) cell to a substantially equal voltage during an initialization phase. The MRAM cell includes a pair of cross-coupled inverters, a first magnetic tunnel junction (MTJ) element, and a second MTJ element. A first inverter of the pair of cross-coupled inverters includes a first transistor coupled to the first node and a second transistor coupled to the first node and to the first MTJ element. A second inverter of the pair of cross-coupled inverters includes a third transistor coupled to the second node and a fourth transistor coupled to the second node and to the second MTJ element. The instructions further cause the processor to initiate storage of a physically unclonable function (PUF) output bit at the MRAM cell during a PUF content generation phase.

Other aspects, advantages, and features of the present disclosure will become apparent after review of the entire application, including the following sections: Brief Description of the Drawings, Detailed Description, and the Claims.

IV. BRIEF DESCRIPTION OF THE DRAWINGS

V. DETAILED DESCRIPTION

Figure 1:
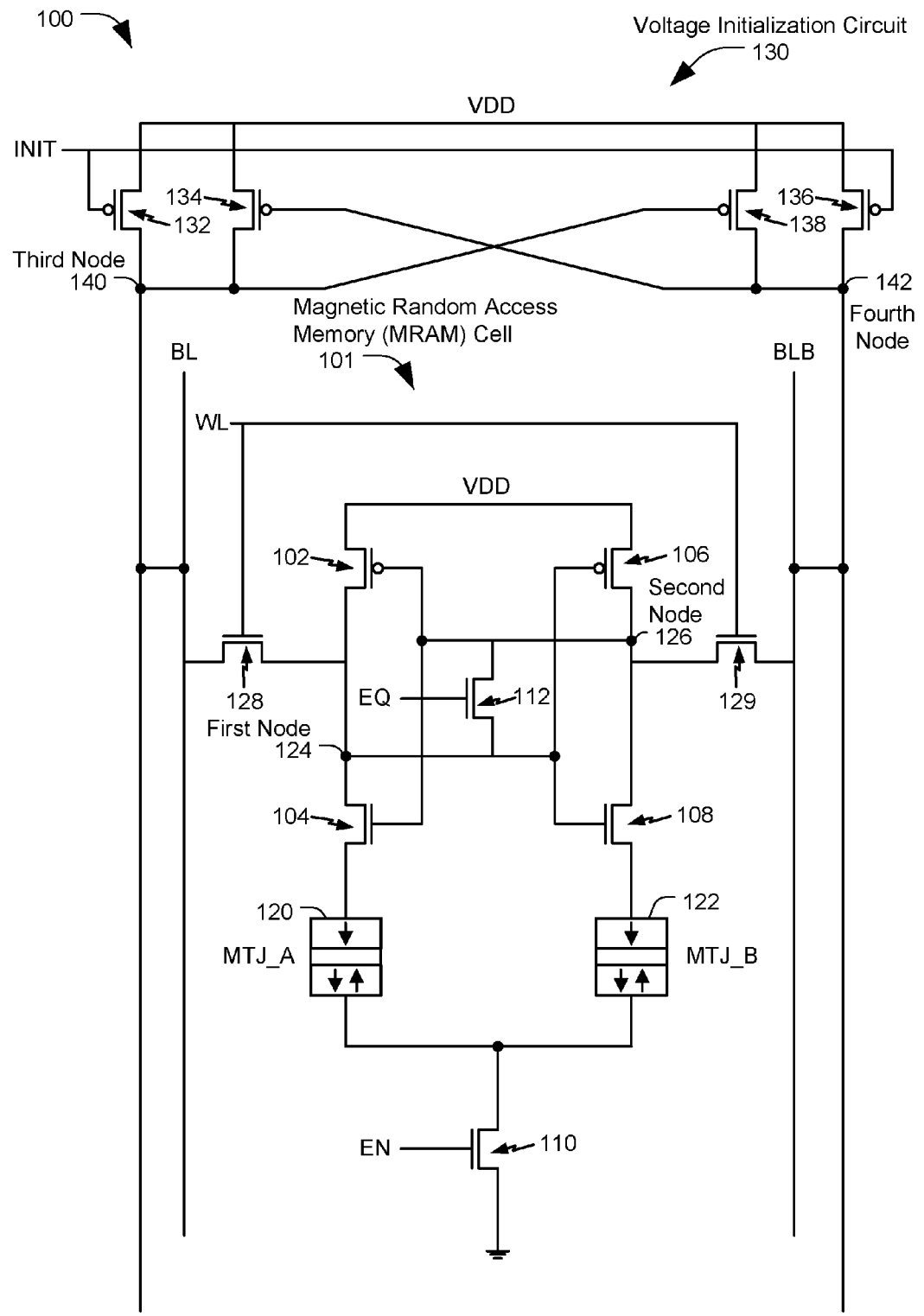
FIG. 1 is a block diagram of a particular illustrative aspect of a system that includes a magnetic random access memory (MRAM) cell that is configured to generate a physically unclonable function (PUF) output bit based on resistances of magnetic tunnel junction (MTJ) elements and strengths of transistors.

Particular aspects of the present disclosure are described below with reference to the drawings. In the description, common features are designated by common reference numbers throughout the drawings. As used herein, various terminology is used for the purpose of describing particular implementations only and is not intended to be limiting. For example, the singular forms "a," "an," and "the" are intended to include the plural forms as well, unless the context clearly indicates otherwise. It may be further understood that the terms "comprises" and "comprising" may be used interchangeably with "includes" or "including." Additionally, it will be understood that the term "wherein" may be used interchangeably with "where." As used herein, "exemplary" may indicate an example, an implementation, and/or an aspect, and should not be construed as limiting or as indicating a preference or a preferred implementation. As used herein, an ordinal term (e.g., "first," "second," "third," etc.) used to modify an element, such as a structure, a component, an operation, etc., does not by itself indicate any priority or order of the element with respect to another element, but rather merely distinguishes the element from another element having a same name (but for use of the ordinal term). As used herein, the term "set" refers to a grouping of one or more elements, and the term "plurality" refers to multiple elements.

Systems, devices, and methods that generate Physically Unclonable Function (PUF) outputs are disclosed. An array of magnetic random access memory (MRAM) cells may be used to generate a PUF output based on one or more device characteristics, such as resistances of magnetic tunnel junction (MTJ) elements and strengths of transistors of an MRAM cell. The MRAM cell includes a pair of cross-coupled inverters, a first MTJ element coupled to one of the pair of cross-coupled inverters, and a second MTJ element coupled to the other of the pair of cross-coupled inverters. The MRAM cell is coupled to a voltage initialization circuit that is configured to substantially equalize voltages of two nodes of the MRAM cell to a particular voltage during an initialization phase. To illustrate, the voltage initialization circuit may be coupled to a voltage source (e.g., $V_{DD}$) and to bit lines that are coupled to the two nodes of the MRAM cell. The voltage initialization circuit may "pull up" the voltages of the two nodes to $V_{DD}$ during the initialization phase. Additionally, the two MTJ elements may be programmed to an anti-parallel state during the initialization phase.

During a PUF content generation phase, the voltage initialization circuit is decoupled from the MRAM cell and the two nodes are discharged to ground through the pair of cross-coupled inverters and the MTJ elements. Due to manufacturing process variations, transistors of the pair of cross-coupled inverters may have varying strengths and the MTJ elements may have slightly varied resistances. Because of the differences in transistor strength and MTJ resistance, a first current path through one pair of transistors and an MTJ element has a lower resistance than a second current path through the other pair of transistors and the other MTJ element. Because the current paths have different resistances (e.g., due to "competition" of the transistors and the difference in resistance between the MTJ elements), different amounts of current flow through the current paths. The different amounts of current cause one node to discharge while the other node remains charged. The PUF output bit for the MRAM cell corresponds to the voltage level of the first node (or the opposite of the voltage level of the second node) after the PUF content generation phase. For example, the PUF output bit of the MRAM cell is a logical one value in response to the first node being charged (e.g., having a high voltage value) after the PUF content generation phase and the PUF output bit is a logical zero value in response to the first node being discharged (e.g., having a low voltage value) after the PUF content generation phase.

The device may include an array of MRAM cells configured to generate a PUF output including a plurality of PUF output bits. The MRAM array may implement a PUF that has a unique "response" to each of multiple "challenges." To illustrate, a challenge may refer to an address of a set of MRAM cells of the MRAM array, and a response may refer to the PUF output generated by the addressed MRAM cells. Each challenge and response may form a challenge-response pair. Because the PUF output is based on resistances of MTJ elements and strengths of transistors of each MRAM cell, each challenge is unique to the particular device and is difficult (or impossible) to replicate using a different device. To illustrate, a different device with a similarly designed MRAM array would likely generate a different response (e.g., PUF output) to a particular challenge because process variations cause unpredictable differences in the resistances of MTJ elements and strengths of the transistors. Additionally, because the manufacturing process variations that influence the PUF output are unpredictable, it is difficult or impossible for the PUF output to be determined by an outside party. Because the PUF output is secure (e.g., difficult or impossible to replicate with other devices) and volatile (e.g., the PUF content is not stored while a device is powered down), the PUF output may be used as part of a device identifier or a cryptographic key. For example, a device may be authenticated by a secure server that stores a plurality of challenge-response pairs by providing the corresponding response to a challenge received from the server. After authentication, the device may be authorized to access secure content from the server. As an example, a user may purchase media content for the device, and the device identifier (including or based on the PUF output) may be used by a service provider server to authenticate the device prior to enabling transmission of the media content. Additionally or alternatively, a cryptographic key may be generated based on the PUF output.

Because the PUF output is determined without comparing resistances of MTJ elements of different cells using a sense amplifier, the PUF output is not degraded (e.g., biased toward a particular non-random value) by mismatch in the sense amplifier or by variations in metal lines, such as bit lines, that are external to the cell. Additionally, because the voltage initialization circuit sets the voltage of the two nodes to a particular level (e.g., a high voltage level) during the initialization phase in addition to coupling the two nodes together, differences between the voltages of the two nodes prior to discharge is reduced (or minimized). Reducing (or minimizing) the voltage difference between the nodes reduces (or eliminates) a degrading effect on the PUF output bit (e.g., a difference in voltages of the two nodes may cause the PUF output to bit to be biased toward a particular value).

In a particular implementation, a single transistor is coupled to the two MTJ elements and to ground. The single transistor is configured to couple the two MTJ elements to ground based on an enable signal. For example, during the PUF content generation phase, the single transistor couples the two MTJ elements to ground to enable discharge of the two nodes and programming of the two MTJ elements. Using a single transistor instead of multiple transistors (e.g., one transistor per MTJ element) reduces variation in resistance of the discharge paths that is not based on transistor strengths of the pair of cross-coupled inverters and resistances of the MTJ elements. Thus, the PUF output generated by the MRAM cell is unique and robust due to the variations in transistor strengths of the pair of cross-coupled inverters and the resistances of the MTJ elements and is not degraded due to external factors (such as distortions caused by sense amplifiers, bit lines, additional circuit elements, etc.).

Referring to FIG. 1, a particular illustrative aspect of a system that includes a magnetic random access memory (MRAM) cell that is configured to generate a physically unclonable function (PUF) output bit based on a comparison of resistances of magnetic tunnel junction (MTJ) elements and strengths of transistors is shown and generally designated 100. In a particular implementation, the system 100 may be included in an MRAM or MRAM device. Additionally or alternatively, the system 100 (or a portion thereof) may be integrated into a processor. The system 100 includes an MRAM cell 101 and a voltage initialization circuit 130. The MRAM cell 101 is configured to generate a PUF output bit, which may be part of a PUF output. The PUF output includes unique, random (or nearly random) information that is generated based on one or more underlying physical characteristics of a device. For example, the PUF output may be based on physical characteristics that are subject to a manufacturing process used to form the device. Because the PUF output is based on physical characteristics particular to the device, the PUF output is difficult (or impossible) to replicate using other devices due to the other devices having different physical characteristics.

The MRAM cell 101 includes a pair of cross-coupled inverters, a first magnetic tunnel junction (MTJ) element 120 (MTJ_A), and a second MTJ element 122 (MTJ_B). The pair of cross-coupled inverters may include a first inverter that includes a first transistor 102 and a second transistor 104 and a second inverter that includes a third transistor 106 and a fourth transistor 108. The first transistor 102 may have a drain (e.g., a drain terminal) coupled to a voltage source ($V_{DD}$) and a source (e.g., a source terminal) coupled to a first node 124. The second transistor 104 may have a drain coupled to the first node 124 and a source coupled to the first MTJ element 120. The third transistor may have a drain coupled to the voltage source ($V_{DD}$) and a source coupled to a second node 126. The fourth transistor 108 may have a drain coupled to the second node 126 and a source coupled to the second MTJ element 122. An output of the first inverter may be coupled to an input of the second inverter and an output of the second inverter may be coupled to an input of the first inverter. For example, the first node 124 (e.g., the output of the first inverter) may be coupled to a gate of the third transistor 106 and to a gate of the fourth transistor 108 (e.g., the input of the second inverter), and the second node 126 (e.g., the output of the second inverter) may be coupled to a gate of the first transistor 102 and to the second transistor 104 (e.g., the input of the first inverter). The first MTJ element 120 may be coupled to the first inverter (e.g., to the second transistor 104) and the second MTJ element 122 may be coupled to the second inverter (e.g., to the fourth transistor 108).

The MTJ elements 120, 122 may be programmed to the same resistance state. In a particular implementation, the MTJ elements 120, 122 are programmed to an anti-parallel state. In this implementation, current may flow from pinned layers to free layers of the MTJ elements 120, 122, as illustrated in FIG. 1. In an alternate implementation, the MTJ elements 120, 122 are programmed to a parallel state, and the MTJ elements 120, 122 are arranged such that current may flow from the free layers to the pinned layers. As used herein, a parallel state corresponds to a polarization of a reference layer of an MTJ element and a polarization of a free layer of the MTJ element having a similar orientation, and an anti-parallel state corresponds to the polarization of the reference layer and the polarization of the free layer having opposite orientations. An MTJ element may have a relatively low resistance (e.g., approximately between 2000 ohms and 4000 ohms) in the parallel state, and an MTJ element may have a relatively high resistance (e.g., approximately between 4000 ohms and 8000 ohms) in the anti-parallel state. Resistance variations for MTJ elements having the same state may be based on a manufacturing process (e.g., based on physical size, chemical composition, or other device characteristics resulting from the manufacturing process). In a particular implementation, each of the MTJ elements 120, 122 are perpendicular MTJ elements. Resistances of perpendicular MTJ elements may be more sensitive to process variations than other types of MTJ elements. In other implementations, the MTJ elements 120, 122 may be other types of MTJ elements.

The MRAM cell 101 also includes a first access transistor 128 coupled to the first node 124 and to a first bit line (BL) and a second access transistor 129 coupled to the second node 126 and to a second bit line (BLB). The second bit line (BLB) may also be referred to as (or replaced with) a sense line (SL). The access transistors 128 and 129 may be configured to enable access to the MRAM cell 101 in response to a wordline (WL). In a particular implementation, the MRAM cell 101 is one of multiple MRAM cells of an MRAM array, as further described with reference to FIG. 3.

The MRAM cell 101 further includes a fifth transistor 110 coupled to the first MTJ element 120 and to the second MTJ element 122. For example, a drain of the fifth transistor 110 may be coupled to the first MTJ element 120 and to the second MTJ element 122 and a source of the fifth transistor 110 may be coupled to ground. The fifth transistor 110 (e.g., a gate of the fifth transistor 110) may be configured to receive an enable signal (EN). The fifth transistor 110 may be configured to selectively couple the first MTJ element 120 and the second MTJ element 122 to ground based on the enable signal. In a particular implementation, the fifth transistor 110 in an n-channel metal-oxide-semiconductor (NMOS) transistor. In other implementations, the fifth transistor 110 is a different type of transistor, such as a p-channel metal-oxide-semiconductor (PMOS) transistor.

In a particular implementation, the MRAM cell 101 includes a sixth transistor 112 coupled to the first node 124 and to the second node 126. The sixth transistor may be configured to selectively short (e.g., couple) the first node 124 to the second node 126 based on an equalization signal (EQ). For example, the sixth transistor 112 (e.g., a gate of the sixth transistor 112) may be configured to receive the equalization signal, and the sixth transistor 112 may short the first node 124 to the second node 126 in response to the equalization signal having a particular value. Additionally, the sixth transistor 112 may be configured to decouple (e.g., isolate) the first node 124 from the second node 126 in response to the equalization signal having a second particular value. In a particular implementation, the sixth transistor 112 is a PMOS transistor. In this implementation, the sixth transistor 112 may be configured to short the first node 124 to the second node 126 in response to the equalization signal having a first value (e.g., a logical "0" value), and the sixth transistor 112 may be configured to decouple the first node 124 from the second node 126 in response to the equalization signal having a second value (e.g., a logical "1" value). In an alternate implementation, the sixth transistor 112 is an NMOS transistor. In this implementation, the sixth transistor 112 may be configured to short the first node 124 to the second node 126 in response to the equalization signal having a first value (e.g., a logical "1" value), and the sixth transistor 112 may be configured to decouple the first node 124 from the second node 126 in response to the equalization signal having a second value (e.g., a logical "0" value). In another particular implementation, the MRAM cell 101 does not include the sixth transistor 112, as further described with reference to FIG. 4.

The voltage initialization circuit 130 is coupled to the MRAM cell 101 and to a voltage source ($V_{DD}$). The voltage initialization circuit 130 may include a seventh transistor 132 coupled to the voltage source and to a third node 140, an eighth transistor 136 coupled to the voltage source and to a fourth node 142, a ninth transistor 134 coupled to the voltage source and to the third node 140, and a tenth transistor 138 coupled to the voltage source and to the fourth node 142. For example, drains of the transistors 132-138 may be coupled to the voltage source ($V_{DD}$), sources of the transistors 132 and 134 may be coupled to the third node 140, and sources of the transistors 136 and 138 may be coupled to the fourth node 142. A gate of the seventh transistor 132 and a gate of the eighth transistor 136 may be configured to receive an initialization signal (INIT). A gate of the ninth transistor 134 may be coupled to the fourth node 142, and a gate of the tenth transistor 138 may be coupled to the third node 140. In a particular implementation, the transistors 132-138 are PMOS transistors, as illustrated in FIG. 1. In other implementations, one or more of the transistors 132-138 may be NMOS transistors. In a particular implementation, control signals (e.g., the enable signal, the equalization signal, and the initialization signal) may be received from a controller, a processor, or other control circuitry that is external to the MRAM cell 101. Alternatively, at least a portion of the control circuitry may be included in the MRAM cell 101.

The third node 140 may be selectively coupled to the first node 124 and the fourth node 142 may be selectively coupled to the second node 126. To illustrate, the third node 140 may be coupled to the first bit line (BL) and the first access transistor 128 may be coupled to the first bit line and the first node 124. The fourth node 142 may be coupled to the second bit line (BLB) and the second access transistor 129 may be coupled to the second bit line and the second node 126. The access transistors 128, 129 may be configured to couple the first node 124 to the first bit line (and the third node 140) and to couple the second node 126 to the second bit line (and the fourth node 142), respectively, in response to the wordline having a particular value (e.g., a logical "1" value).

The voltage initialization circuit 130 may be configured to substantially equalize voltages of the first node 124 and the second node 126 based on the initialization signal. To illustrate, during an initialization phase the initialization signal may have a particular logic value (e.g., a logical "0" value) and the voltage initialization circuit 130 may set the voltages of the third node 140 and the fourth node 142 to a high voltage (e.g., a voltage substantially equal to $V_{DD}$). The wordline may have a particular value (e.g., a logical "1" value) that enables the third node 140 to be coupled to the first node 124 and the fourth node 142 to be coupled to the second node 126, thereby "pulling up" the voltage of the first node 124 and the second node 126 to a substantially equal value (e.g., $V_{DD}$). In some implementations, the MRAM cell 101 may include the sixth transistor 112 to reduce a difference between voltages of the first node 124 and the second node 126.

The MRAM cell 101 may be configured to output a PUF output bit based on resistances of the first MTJ element 120 and the second MTJ element 122 and transistor strengths of the transistors 102-108. As described further herein, the MRAM cell 101 may be configured, during a PUF content generation phase, to cause the first node 124 or the second node 126 to discharge (e.g., to "fall" to a low voltage level). Which of the nodes is discharged during the PUF content generation phase is based on the strengths of the transistors 102-108 and the resistances of the first MTJ element 120 and the second MTJ element 122. Due to differences in the strengths of the transistors 102-108 and the resistances of the MTJ elements 120 and 122, resistances of a first current path (from $V_{DD}$ through the first transistor 102, the second transistor 104, the first MTJ element 120, and the fifth transistor 110) and a second current path (from $V_{DD}$ through the third transistor 106, the fourth transistor 108, the second MTJ element 122, and the fifth transistor 110) are different. Due to the different resistances of the current paths, either the first node 124 or the second node 126 discharges to ground while the other node retains a high voltage level. After the PUF content generation phase, the voltage levels of the first node 124 and the second node 126 are maintained by the cross-coupled inverters. The voltage levels of the nodes 124 and 126 subsequent to the PUF content generation phase represent the PUF output bit. Because the voltage levels of the nodes are maintained by the pair of cross-coupled inverters, the PUF content is maintained while the device is powered on and not while the device is powered off. Thus, the PUF content is volatile. In a particular implementation, the MRAM cell 101 is configured to output the PUF output bit independent of a clock signal. For example, the MRAM cell 101 does not include a flip-flop or other clock signal-dependent circuitry.

The PUF output bit may be part of a PUF output that is generated by an array of MRAM cells, as further described with reference to FIG. 3. In a particular implementation, a product identifier includes (or is based on) the PUF output. In another particular implementation, a cryptographic key includes (or is based on) the PUF output.

Operation of the MRAM cell 101 includes one or more phases. The control signals (e.g., the initialization signal, the enable signal, the equalization signal, and the wordline) have different values during the different phases, as illustrated in diagram 200 of FIG. 2. In the particular implementation illustrated in FIG. 2, the one or more phases include an initialization phase 202, a PUF content generation phase 204, a read phase 206, and an idle phase 208. In other implementations, the one or more phases include more or fewer phases than illustrated in FIG. 2.

The voltage initialization circuit 130 may initialize voltages of the first node 124 and the second node 126 to a substantially equal voltage during the initialization phase 202. Prior to the initialization phase 202, the transistors 134 and 138 may maintain the voltages of the third node 140 and the fourth node 142 within a particular voltage range. For example, in response to the voltages falling below a particular voltage, such as $V_{th}$ of the transistors 134 and 138, the transistors 134 and 138 may turn on and raise the voltage to $V_{DD}$ before being turned off again. This process may repeat to maintain the voltages of the third node 140 and the fourth node 142 within a particular voltage range (e.g., between $V_{DD}$ and approximately $V_{th}$). During the initialization phase 202 the initialization signal (INIT) may have a particular value (e.g., a logical "0" value). The seventh transistor 132 and the eighth transistor 136 may be enabled in response to the initialization signal having the particular value to set the voltages of the third node 140 and the fourth node 142 to $V_{DD}$.

During the initialization phase 202 the wordline may have a particular value (e.g., a logical "1" value) that turns on (e.g., enables) the access transistors 128 and 129 and causes the third node 140 to be coupled to the first node 124 and the fourth node 142 to be coupled to the second node 126. Coupling the third node 140 to the first node 124 (via the first bit line and the first access transistor 128) "pulls up" (e.g., raises) the voltage of the first node 124 to $V_{DD}$. Coupling the fourth node 142 to the second node 126 (via the second bit line and the second access transistor 129) pulls up the voltage of the second node 126 to $V_{DD}$. Additionally, during the initialization phase 202, the first MTJ element 120 and the second MTJ element 122 may be initialized to anti-parallel states without using write circuitry. To illustrate, the MRAM cell 101 does not include and is not coupled to write circuitry. The initialization may include applying a magnetic field to the first MTJ element 120 and the second MTJ element 122. In other implementations, the first MTJ element 120 and the second MTJ element 122 may be initialized to the parallel state.

In a particular implementation, the equalization signal (EQ) may have a particular value (e.g., a logical "0" value) during the initialization phase 202 and, in response to the equalization signal having the particular value, the sixth transistor 112 may couple (e.g., short) the first node 124 to the second node 126 to substantially equalize the voltages of the first node 124 and the second node 126. Using the sixth transistor 112 to couple the first node 124 to the second node 126 may reduce or eliminate a voltage difference between the first node 124 and the second node 126. In an alternate implementation, the sixth transistor 112 and the equalization signal are not included, and the voltages of the first node 124 and the second node 126 are individually pulled to $V_{DD}$ by the voltage initialization circuit 130, as described with reference to FIG. 4.

During the PUF content generation phase 204 a PUF output bit is stored at the MRAM cell 101. To illustrate, during the PUF content generation phase 204 the initialization has a second particular value (e.g., a logical "1" value) and the wordline has a second particular value (e.g., a logical "0" value) that causes the first node 124 to be decoupled from the third node 140 and the second node 126 to be decoupled from the fourth node 142. Additionally, the equalization signal has a second particular value (e.g., a logical "1" value) that causes the first node 124 to be decoupled from the second node 126. During the PUF content generation phase 204 the enable signal (EN) has a particular value (a logical "1") value that turns on (e.g., enables) the fifth transistor 110 and couples the first MTJ element 120 and the second MTJ element 122 to ground. A first current path is formed from $V_{DD}$ through the first transistor 102, the first node 124, the second transistor 104, the first MTJ element 120, and the fifth transistor 110 to ground. Additionally, a second current path is formed from $V_{DD}$ through the third transistor 106, the second node 126, the fourth transistor 108, the second MTJ element 122, and the fifth transistor 110 to ground.

Due to variations in the strengths of the transistors 104 and 108 and variations in the resistances of the MTJ elements 120 and 122, one current path may have less overall resistance than the other current path, causing the voltage of one of the first node 124 and the second node 126 to drop. As the voltage at one of the nodes 124 or 126 drops, one of the first transistor 102 and the third transistor 106 turns on to provide a current path between the corresponding node and $V_{DD}$. Due to differences in the strengths of the transistors 102-108 and a difference in the resistances of the MTJ elements 120 and 122, the voltage of one of the first node 124 or the second node 126 is pulled down to a low voltage level while the voltage of the other node is maintained at a high voltage level. After the voltage levels of the first node 124 and the second node 126 stabilize, the voltage levels are maintained by the pair of cross-coupled inverters (e.g., the transistors 102-108). The PUF output bit may be represented by a logical value that corresponds to the voltage level (e.g., the charge state) of the first node 124 (or the opposite of the voltage level of the second node 126). Alternatively, the PUF output bit may be represented by a logical value that corresponds to the voltage level of the second node 126 (or the opposite of the voltage level of the first node 124). Because the first MTJ element 120 and the second MTJ element 122 are arranged as illustrated in FIG. 1, current flow through either of the MTJ elements 120 or 122 does not cause the resistance state of the MTJ elements 120 and 122 to change. For example, the MTJ elements 120 and 122 are initialized in the anti-parallel state, current flow from the pinned layer to the free layer (as illustrated in FIG. 1) maintains the MTJ elements 120 and 122 in the anti-parallel state. In other implementations, the MTJ elements 120 and 122 may be initialized to the parallel state, and the MTJ elements 120 and 122 may be arranged such that current flows from the free layer to the pinned layer and maintains the MTJ elements 120 and 122 in the parallel state.

During the read phase 206, the enable signal is de-asserted (e.g., has a logical "0" value) to decouple the MTJ elements 120 and 122 from ground and the PUF output bit is read from the MRAM cell 101. To illustrate, during the read phase 206 the wordline has a logical "1" value which causes the access transistors 128 and 129 to couple the first node 124 to the third node 140 and to couple the second node 126 to the fourth node 142. Because the initialization signal has a logical "1" value during the read phase 206, the seventh transistor 132 and the eighth transistor 136 are turned off, thus the voltages of the third node 140 and the fourth node 142 are not pulled to $V_{DD}$. Instead, the voltage of the third node 140 tracks the voltage of the first node 124 and the voltage of the fourth node 142 tracks the voltage of the second node 126.

For example, if the first node 124 has a high voltage level and the second node 126 has a low voltage level (due to storage of the PUF content), the voltage of the fourth node 142 may be pulled down to the low voltage level of the second node 126. In response to the voltage of the fourth node 142 having the low voltage level, the ninth transistor 134 may be turned on, which pulls the voltage of the third node 140 to $V_{DD}$, thereby tracking the high voltage level of the first node 124. Alternatively, if the first node 124 has a low voltage level and the second node 126 has a high voltage level (due to storage of the PUF content), the voltage of the third node 140 may be pulled down to the low voltage level of the first node 124. In response to the voltage of the third node 140 having the low voltage level, the tenth transistor 138 may be turned on, which pulls the voltage of the fourth node 142 to $V_{DD}$, thereby tracking the high voltage level of the second node 126. The voltage of the first node 124 (and the third node 140) may be provided to an output stage via the first bit line (BL) and the voltage of the second node 126 (and the fourth node 142) may be provided to the output stage via the second bit line (BLB). The output stage may generate a PUF output indicative of one or more PUF output bits based on voltages on a plurality of bit lines (including the first bit line and the second bit line) during the read phase 206.

During the idle phase 208, the first node 124 and the second node 126 may maintain their respective voltages (and the first MTJ element 120 and the second MTJ element 122 may maintain their respective resistance states). To illustrate, during the idle phase 208, the wordline is de-asserted to decouple the MRAM cell 101 from the bit lines and the voltage initialization circuit 130. Additionally, the fifth transistor 110 is turned off based on the enable signal being de-asserted, thereby decoupling the first MTJ element 120 and the second MTJ element 122 from ground. The sixth transistor 112 is also turned off based on the equalization signal to isolate the first node 124 from the second node 126, thereby maintaining the respective voltages of the first node 124 and the second node 126 during the idle phase 208.

The MRAM cell 101 of FIG. 1 may generate a PUF output bit based on device-specific characteristics that vary from device to device due to a manufacturing process. For example, the PUF output bit is determined based on strengths of transistors and resistances of MTJ elements of a single MRAM cell, which are subject to process variations. Because the PUF output bit of the MRAM cell 101 is generated based on resistances of the first MTJ element 120 and the second MTJ element 122 and strengths of the transistors 102-108, the PUF output bit is robust and difficult (or impossible) to replicate using a different device. For example, device-specific characteristics of another device likely cause a similarly designed MRAM cell to output a different PUF output bit at the other device. Thus, a device identifier or cryptographic key that includes (or is based on) the PUF output bit is unique to the device and is difficult to determine at another device due to the PUF output bit being based on uncontrollable manufacturing process variations. Additionally, because PUF content stored in the MRAM cell 101 is volatile, the PUF content is more secure than if the PUF content were maintained in non-volatile storage that may be accessible to an outside party while the device is powered down.

Further, because the PUF output is determined without comparing resistances of MTJ elements of different MRAM cells and without using a sense amplifier, differences in metal lines (e.g., bit lines, source lines, word lines, etc.) and mismatch in the sense amplifier do not cause the PUF output bit to be biased toward a particular value. Additionally, because the voltage initialization circuit 130 pulls up the voltages of the nodes 124 and 126 to a particular level (e.g., $V_{DD}$) in addition to coupling the first node 124 to the second node 126 during the initialization phase 202, a difference between the voltages of the first node 124 and the second node 126 is reduced (or minimized) as compared to attempting to equalize the voltages to a floating voltage. Reducing voltage differences between the first node 124 and the second node 126 reduces a likelihood that a voltage difference will contribute to biasing the PUF output bit toward a particular value. Additionally, using a single transistor (e.g., the fifth transistor 110) instead of multiple transistors to couple the MTJ elements 120 and 122 to ground reduces variation in resistance of the discharge paths that is not related to the transistors 102-108 and the MTJ elements 120 and 122. Thus, the PUF output experiences less (or no) degradation due to characteristics of elements other than the transistors 102-108 and the MTJ elements 120 and 122.

Figure 3:
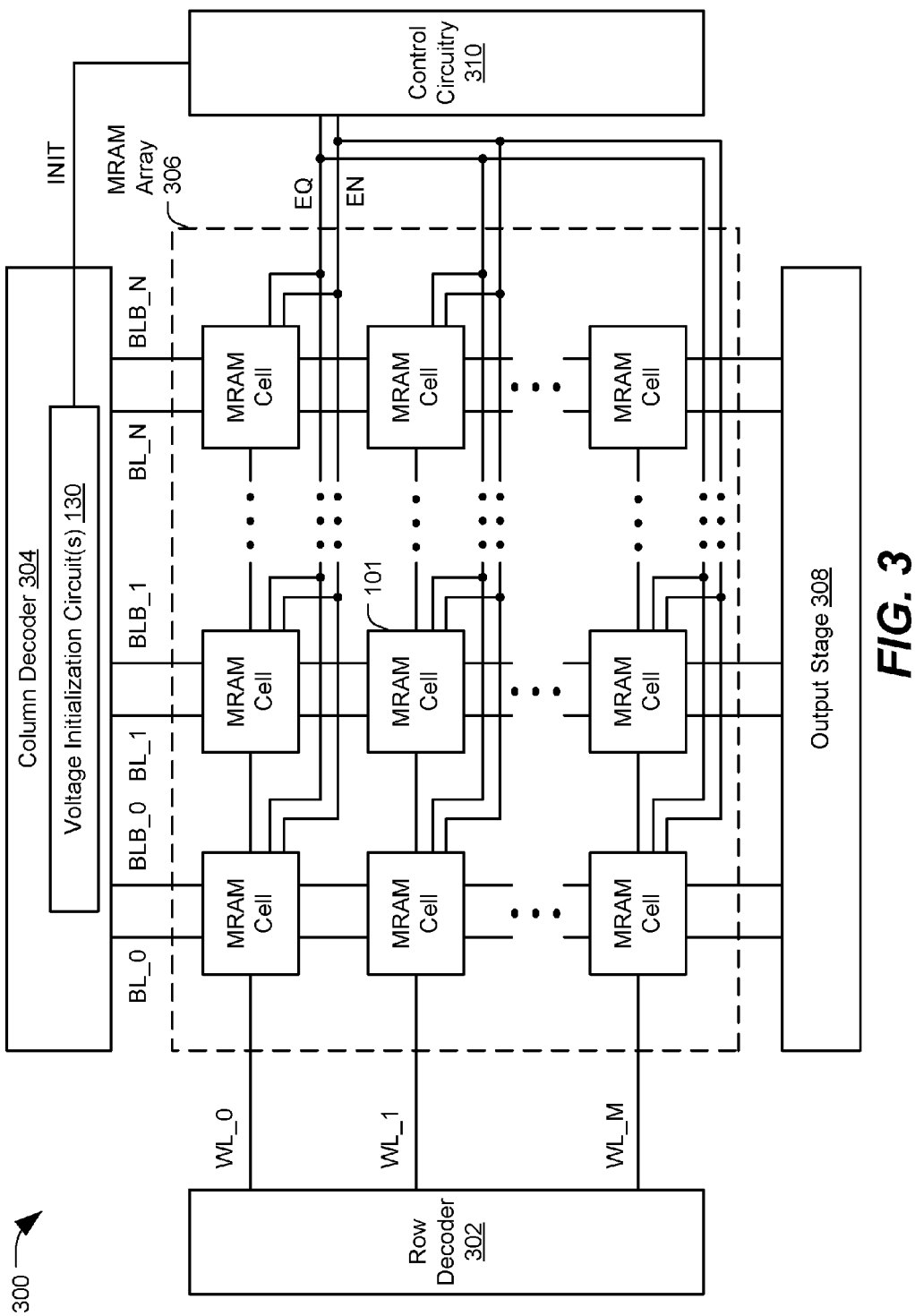
FIG. 3 is a block diagram of a particular illustrative aspect of a system that includes a magnetic random access memory (MRAM) array configured to generate a PUF output including PUF output bits from multiple MRAM cells.

Referring to FIG. 3, an illustrative implementation of a particular illustrative aspect of a system that includes an MRAM array configured to generate a PUF output including PUF output bits from multiple MRAM cells is shown and generally designated 300. In a particular implementation, the system 300 may be included in a magnetic random access memory (MRAM) or MRAM device. Additionally or alternatively, the system 300 (or a portion thereof) may be integrated into a processor. The system 300 includes a row decoder 302, a column decoder 304, an MRAM array 306, an output stage 308, and control circuitry 310. As illustrated in FIG. 3, the MRAM array 306 includes a plurality of MRAM cells, including the illustrative MRAM cell 101 of FIG. 1. Each MRAM cell of the MRAM array 306 is configured to store a PUF output bit, as described with reference to FIG. 1.

The row decoder 302 may be coupled to the MRAM array 306 via wordlines WL_0-WL_M and configured to assert one or more word lines in response to a particular address received by the system 300. The column decoder 304 may be coupled to the MRAM array 306 via bit lines BL_0-BL_N and BLB_0-BLB_N. The column decoder 304 may be configured to charge one or more bit lines during a read phase. For example, the column decoder 304 may include one or more voltage initialization circuits 130. As described with reference to FIG. 1, the one or more voltage initialization circuits 130 may cause voltages of bit lines to track voltages of nodes of a corresponding MRAM cell during a read operation. In addition, as described with reference to FIG. 1, the one or more voltage initialization circuits 130 may raise the voltages of bit lines (and thereby nodes of the corresponding MRAM cells) during an initialization phase. Although described as being included in the column decoder 304, in other implementations the one or more voltage initialization circuits 130 may be external to the column decoder 304. For example, the one or more voltage initialization circuits 130 may be coupled between the column decoder 304 and the MRAM array 306. In some implementations, each column of the MRAM array 306 may have a corresponding voltage initialization circuit 130. In other implementations, more or fewer voltage initialization circuits 130 may be included in the system 300.

The output stage 308 may be coupled to the MRAM array 306 via the bit lines BL_0-BL_N and BLB_0-BLB_N. The output stage 308 may be configured to generate a PUF output based on voltages of the bit lines during a read phase. As described with reference to FIG. 1, the voltages of the bit lines during the read phase are indicative of PUF output bits of MRAM cells coupled to the bit lines (e.g., via access transistors). Thus, each MRAM cell of the MRAM array 306 is configured to output a PUF output bit if selected during a read phase.

The control circuitry 310 may include circuitry configured to generate the control signals described with reference to FIG. 1. For example, the control circuitry 310 may be configured to generate the initialization signal (INIT), the enable signal (EN), and the equalization signal (EQ). In other implementations, the control circuitry 310 may be configured to generate more or fewer control signals than illustrated in FIG. 3. The initialization signal may be provided to the one or more voltage initialization circuits 130. The enable signal and the equalization signal may be provided to the MRAM cells of the MRAM array 306. The control signals (e.g., the initialization signal, the enable signal, and the equalization signal) may have particular values during different phases, as described with reference to FIG. 2. In other implementations, the control circuitry 310 may include a controller, a processor, a microprocessor, a field-programmable gate array (FPGA), an application-specific integrated circuit (ASIC), or other hardware or circuitry configured to perform the operations of the control circuitry 310.

Figure 2:
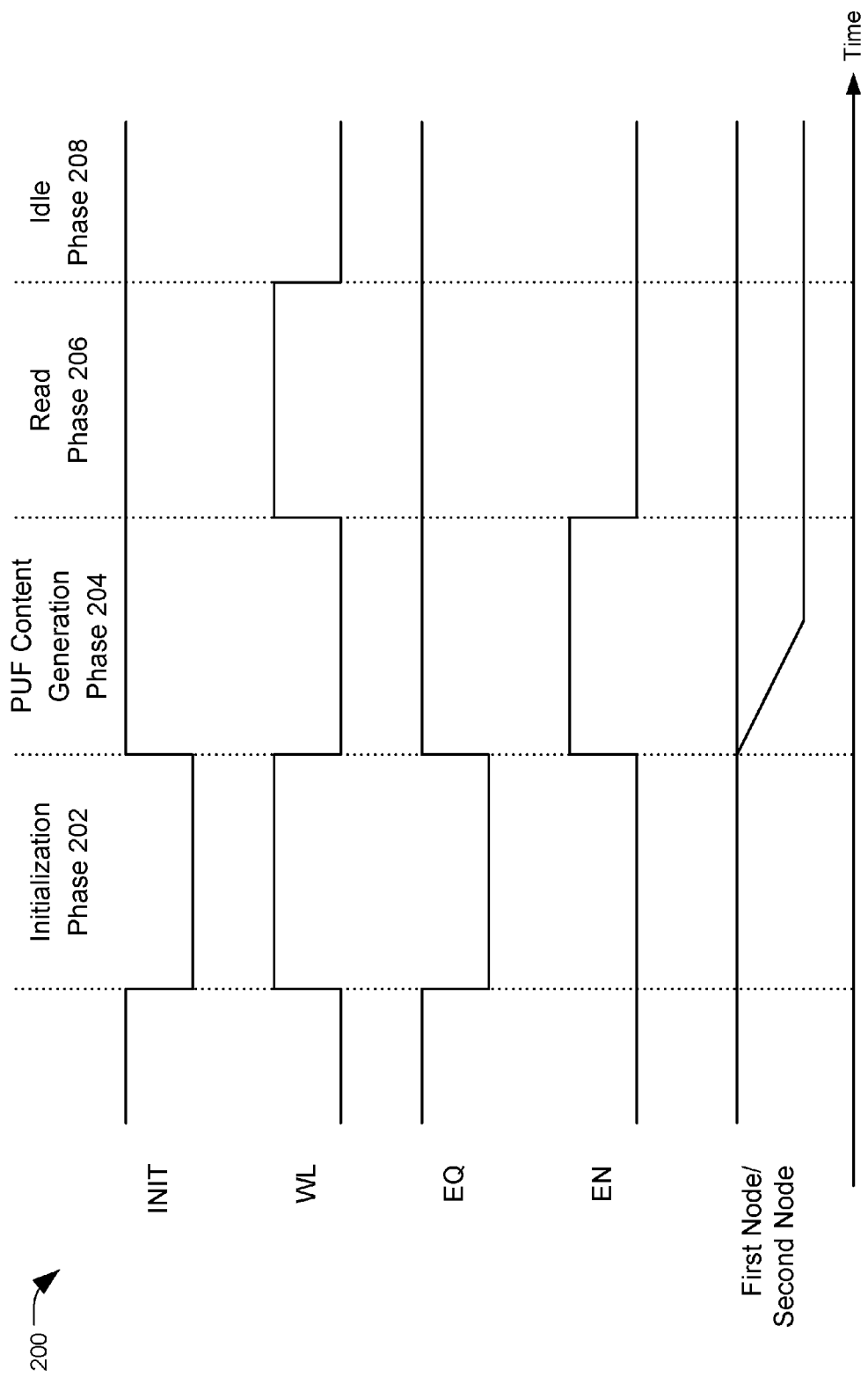
FIG. 2 is a diagram illustrating control signals provided to an MRAM cell configured to generated a PUF output bit and to a voltage initialization circuit coupled to the MRAM cell.

During operation, the control circuitry 310 may assert and de-assert the control signals (e.g., the initialization signal, the enable signal, and the equalization signal) as described with reference to FIG. 2 to cause the MRAM cells of the MRAM array 306 to be initialized and to generate and store PUF content. During a read phase, the system 300 may output a PUF output. To illustrate, the output stage 308 may output a PUF output (e.g., a "response") in response to a particular address (e.g., a "challenge"). The row decoder 302 and the column decoder 304 may receive an address that is indicative of one or more MRAM cells of the MRAM array 306. The row decoder 302 may assert one or more wordlines to enable access to the indicated MRAM cells, and the column decoder 304 may enable respective voltage initialization circuits 130 to cause voltages of bit lines to track voltages of nodes of the corresponding MRAM cells, as described with reference to FIG. 1. The output stage 308 may generate a PUF output based on the voltages of the bit lines. In a particular implementation, the PUF output may include a PUF output bit stored at the MRAM cell 101 (e.g., in response to an address that indicates the MRAM cell 101). In this manner, the MRAM array 306 may output different PUF outputs (e.g., different "responses") based on different addresses (e.g., different "challenges").

A product identifier (or an identification or authorization process using PUF challenges and responses), a cryptographic key, or both may include (or be generated based on) the PUF output. Because the PUF output is based on process-dependent variations at components (e.g., MTJ elements and transistors) of each MRAM cell at the particular device, the device identifier or the cryptographic key may be difficult or impossible to generate at another device. For example, another device including an MRAM array of similarly configured MRAM cells likely generates a different PUF output in response to a particular challenge due to device-specific differences in transistor strengths and MTJ element resistances. Thus, another device with the same configuration may generate a different PUF output, and therefore a different device identifier (or cryptographic key).

Thus, the system 300 of FIG. 3 may enable generation of multiple different PUF outputs based on different "challenges." Because each PUF output is based on differences in transistor strengths and MTJ element resistances of a plurality of MRAM cells, each PUF output is difficult (or impossible) to replicate using a different device. In this manner, the system 300 provides robust and unique PUF outputs that are not degraded due to process variations of components outside of the MRAM cells, such as wordlines, bit lines, sense amplifiers, etc.

Figure 4:
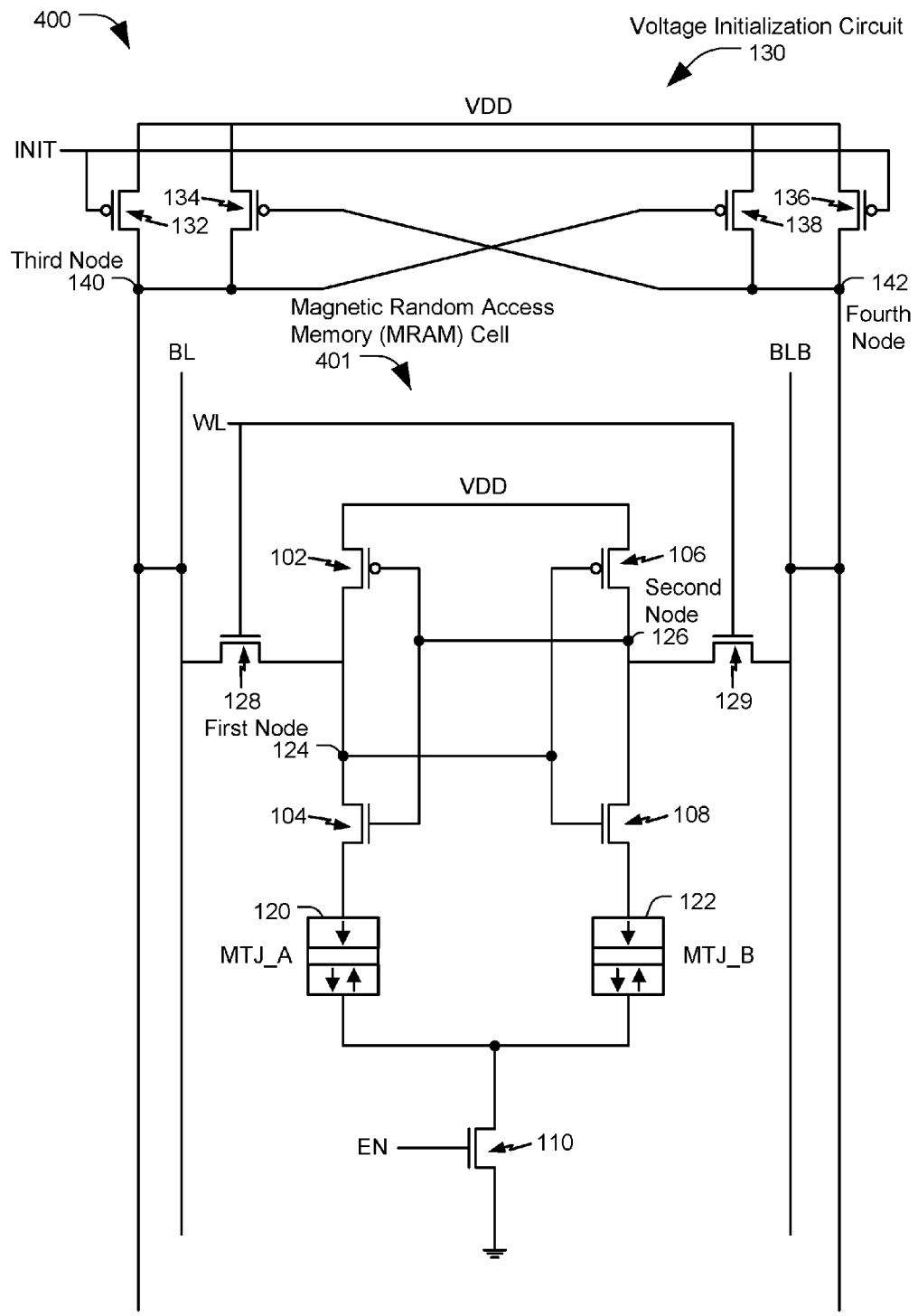
FIG. 4 is a block diagram of a second particular aspect of a system that includes an MRAM cell that is configured to generate a PUF output bit based on resistances of MTJ elements and strengths of transistors.

Referring to FIG. 4, a second particular aspect of a system that includes an MRAM cell that is configured to generate a PUF output bit based on resistances of MTJ elements and strengths of transistors is shown and generally designated 400. In a particular implementation, the system 400 may be included in a magnetic random access memory (MRAM) or MRAM device. Additionally or alternatively, the system 400 (or a portion thereof) may be integrated into a processor. The system 400 includes an MRAM cell 401 and the voltage initialization circuit 130. The MRAM cell 401 is configured to generate a PUF output bit, which may be part of a PUF output.

The MRAM cell 401 includes a pair of cross-coupled inverters (e.g., the transistors 102-108), the first MTJ element 120, the second MTJ element 122, the fifth transistor 110, the first node 124, the second node 126, the first access transistor 128, and the second access transistor 129, as described with reference to FIG. 1. The voltage initialization circuit 130 includes the transistors 132-138, as described with reference to FIG. 1. In contrast to the MRAM cell 101 of FIG. 1, the MRAM cell 401 of FIG. 4 does not include the sixth transistor 112. As illustrated in FIG. 4, there is no transistor coupling the first node 124 to the second node 126. Thus, the MRAM cell 401 has a reduced circuit area as compared to the MRAM cell 101 of FIG. 1.

During operation, the MRAM cell 401 operates as described with reference to FIG. 1 during the PUF content generation phase 204, the read phase 206, and the idle phase 208. During the initialization phase 202, the initialization signal has a particular value (e.g., a logical "0" value) that causes the third node 140 and the fourth node 142 to be pulled up to $V_{DD}$. The wordline has a particular value (a logical "1" value) that causes the first node 124 to be coupled to the third node 140 and the second node 126 to be coupled to the fourth node 142. In this manner, voltages of the first node 124 and the second node 126 are pulled up to $V_{DD}$ (e.g., a substantially similar voltage). Because the first node 124 is not coupled to the second node 126 by a transistor (e.g., the sixth transistor 112), initialization of the MRAM cell 401 may take more time than the initialization of the MRAM cell 101.

Thus, the system 400 of FIG. 4 represents a tradeoff between reducing circuit area (e.g., because the system 400 does not include the sixth transistor 112) and efficiency in equalizing the voltages of the first node 124 and the second node 126 during the initialization phase 202 (e.g., because the first node 124 and the second node 126 are not coupled together by the sixth transistor 112 during the initialization phase 202).

Figure 5:
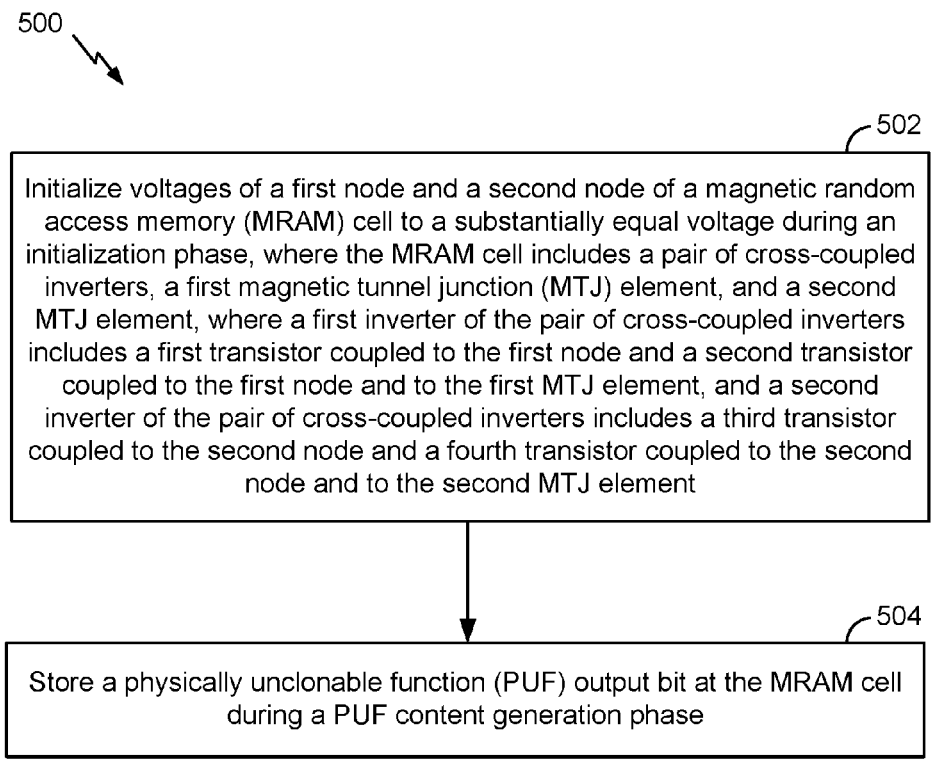
FIG. 5 is a flow chart that illustrates a particular method of generating PUF output bits based on resistances of MTJ elements and strengths of transistors of an MRAM cell.

Referring to FIG. 5, a flow chart of a particular illustrative implementation of a method of generating PUF output bits based on resistances of MTJ elements and strengths of transistors of an MRAM cell is shown and generally designated 500. The method 500 may be performed by the system 100 of FIG. 1, the system 300 of FIG. 3, or the system 400 of FIG. 4, as non-limiting examples.

The method 500 includes initializing voltages of a first node and a second node of an MRAM cell to a substantially equal voltage during an initialization phase, at 502. The MRAM cell may include a pair of cross-coupled inverters, a first MTJ element, and a second MTJ element. A first inverter of the pair of cross-coupled inverters may include a first transistor coupled to the first node and a second transistor coupled to the first node and to the first MTJ element. A second inverter of the pair of cross-coupled inverters may include a third transistor coupled to the second node and a fourth transistor coupled to the second node and to the second MTJ element. To illustrate, with reference to FIG. 1, the voltage initialization circuit 130 may initialize voltages of the first node 124 and the second node 126 to a substantially equal voltage (e.g., $V_{DD}$) during the initialization phase 202. For example, the voltages of the third node 140 and the fourth node 142 may be pulled up to $V_{DD}$ by the voltage initialization circuit 130, and the first node 124 may be coupled to the third node 140 and the second node 126 may be coupled to the fourth node 142 to set the voltages of the first node 124 and the second node 126 to $V_{DD}$.

The method 500 further includes storing a physically unclonable function (PUF) output bit at the MRAM cell during a PUF content generation phase, at 504. For example, with reference to FIG. 1, the MRAM cell 101 may store a PUF output bit during the PUF content generation phase 204. The PUF output bit corresponds to a voltage level of the first node subsequent to the PUF content generation phase. Additionally or alternatively, the PUF output bit may correspond to a voltage level of the second node subsequent to the PUF content generation phase. In particular implementation, a PUF output of an MRAM array includes the PUF output bit, and a product identifier may include (or be based on) the PUF output. Additionally or alternatively, a cryptographic key may include (or be based on) the PUF output.

In a particular implementation, the method 500 includes, during the initialization phase, initializing the first MTJ element and the second MTJ elements to anti-parallel states without using write circuitry. For example, the first MTJ element 120 and the second MTJ element 122 may be initialized via current flow through the MRAM cell 101, which does not include write circuitry. In an alternate implementation, the first MTJ element 120 and the second MTJ element 122 may be initialized to parallel states.

In another particular implementation, during the initialization phase, the voltages of the first node and the second node are initialized to a high voltage level via a voltage initialization circuit. For example, the first node 124 may be coupled to the third node 140 and the second node 126 may be coupled to the fourth node 142 during the initialization phase. The third node 140 and the fourth node 142 (and thus the first node 124 and the second node 126) may be pulled to $V_{DD}$ by the voltage initialization circuit 130. In a particular implementation, during the PUF content generation phase, a first voltage level of the first node may be set based on a first current through the first transistor, the second transistor, and a second voltage level of the second node may be set based on a second current through the third transistor, the fourth transistor, and the second MTJ element. For example, during the PUF content generation phase 204, a first current may flow from $V_{DD}$ through the first transistor 102, the second transistor 104, the first MTJ element 120, and the fifth transistor 110 to ground, and a second current may flow from $V_{DD}$ through the third transistor 106, the fourth transistor 108, the second MTJ element 122, and the fifth transistor 110 to ground. The voltage level of the first node 124 may be based on the first current, and the voltage level of the second node 126 may be based on the second current.

Additionally or alternatively, the method 500 may include providing an enable signal to a fifth transistor. The fifth transistor may selectively couple the first MTJ element and the second MTJ element to ground based on an enable signal. For example, the control circuitry 310 of FIG. 3 may provide the enable signal (EN) to the fifth transistor 110, and the fifth transistor 110 may selectively couple the first MTJ element 120 and the second MTJ element 122 to ground based on the enable signal. Additionally or alternatively, the method 500 may include providing an equalization signal to a sixth transistor coupled to the first node and to the second node. In a particular implementation, the sixth transistor shorts (e.g., couples) the first node to the second node in response to the equalization signal having a particular value. For example, the control circuitry 310 of FIG. 3 may provide the equalization signal (EQ) to the sixth transistor 112 and the sixth transistor 112 may short the first node 124 to the second node 126 in response to the equalization signal having a particular value (e.g., a logical "1" value).

Additionally or alternatively, the method 500 may include providing an initialization signal to gates of a seventh transistor and an eighth transistor of the voltage initialization circuit. The seventh transistor may be coupled to a voltage source and to a third node, the eighth transistor may be coupled to a voltage source and to a fourth node, the fourth node may be coupled to a gate of a ninth transistor that is coupled to the voltage source and to the third node, and the third node may be coupled to a gate of a tenth transistor that is coupled to the voltage source and to the fourth node. For example, the control circuitry 310 of FIG. 3 may provide the initialization signal (INIT) to the gates of the seventh transistor 132 and the eighth transistor 136 of the voltage initialization circuit 130.

The method 500 enables generation of a PUF output bit based on device-specific characteristics that vary from device to device due to a manufacturing process. Because the PUF output bit is determined based on strengths of transistors and resistances of MTJ elements, which are subject to process variations, the PUF output bit is highly robust and difficult (or impossible) to replicate using a different device. Further, because the PUF output is determined without comparing resistances of MTJ elements of different MRAM cells and without using a sense amplifier, differences in metal lines (e.g., bit lines, source lines, word lines, etc.) and mismatch in the sense amplifier do not cause a value of a PUF output bit to be biased toward a particular value. Additionally, because the voltages of the nodes are set to a particular level (e.g., $V_{DD}$) in addition to the nodes being coupled together during the initialization phase, voltage difference between the two nodes (and potential bias to the PUF output bit) is reduced (or minimized). Additionally, because the PUF content is volatile, the security of the PUF content is increased as compared to devices that store PUF content in a non-volatile memory.

Figure 6:
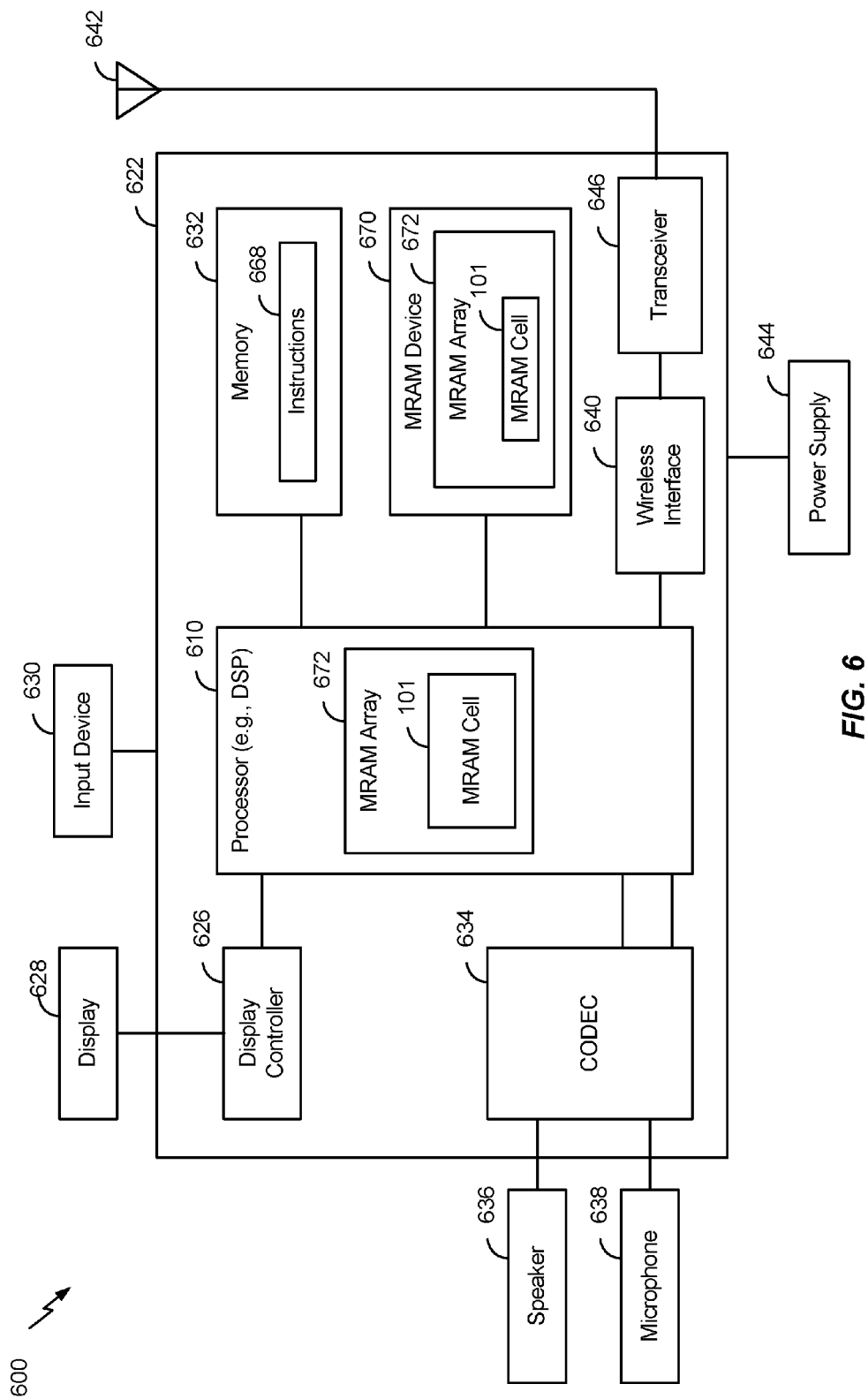
FIG. 6 is a block diagram of a wireless device that includes an MRAM cell that is configured to generate a PUF output bit based on resistances of MTJ elements and strengths of transistors.

Referring to FIG. 6, a block diagram of a particular illustrative implementation of a device (e.g., a wireless communication device) is depicted and generally designated 600. In various implementations, the device 600 may have more or fewer components than illustrated in FIG. 6.

In a particular implementation, the device 600 includes a processor 610, such as a central processing unit (CPU) or a digital signal processor (DSP), coupled to a memory 632. The memory 632 includes instructions 668 (e.g., executable instructions) such as computer-readable instructions or processor-readable instructions. The instructions 668 may include one or more instructions that are executable by a computer, such as the processor 610. The processor 610 is also coupled to an MRAM device 670. An MRAM array 672 may be included in the MRAM device 670. For example, the MRAM device 670 may include an array of MRAM cells, including the MRAM cell 101, that is configured to generate PUF outputs (e.g., a "response") based on a "call" (e.g., one or more selected rows or columns). Additionally or alternatively, the MRAM array 672 (including the MRAM cell 101) may be included in the processor 610. The PUF outputs may be used as an identifier for the device 600 or as a cryptographic key, as non-limiting examples. In a particular implementation, the processor 610, the MRAM device 670, or both may include the system 100 of FIG. 1, the system 300 of FIG. 3, or the system 400 of FIG. 4. For example, the processor 610 (or the MRAM device 670) may include the MRAM cell 101, the voltage initialization circuit 130, the row decoder 302, the column decoder 304, the MRAM array 306, the output stage 308, or the MRAM cell 401 of FIGS. 1, 3, and 4.

FIG. 6 also illustrates a display controller 626 that is coupled to the processor 610 and to a display 628. A coder/decoder (CODEC) 634 may also be coupled to the processor 610. A speaker 636 and a microphone 638 may be coupled to the CODEC 634.

FIG. 6 also illustrates that a wireless interface 640, such as a wireless controller, and a transceiver 646 may be coupled to the processor 610 and to an antenna 642, such that wireless data received via the antenna 642, the transceiver 646, and the wireless interface 640 may be provided to the processor 610. In some implementations, the processor 610, the display controller 626, the memory 632, the CODEC 634, the MRAM device 670, the wireless interface 640, and the transceiver 646 are included in a system-in-package or system-on-chip device 622. In some implementations, an input device 630 and a power supply 644 are coupled to the system-on-chip device 622. Moreover, in a particular implementation, as illustrated in FIG. 6, the display 628, the input device 630, the speaker 636, the microphone 638, the antenna 642, and the power supply 644 are external to the system-on-chip device 622. In a particular implementation, each of the display 628, the input device 630, the speaker 636, the microphone 638, the antenna 642, and the power supply 644 may be coupled to a component of the system-on-chip device 622, such as an interface or a controller.

The device 600 may include a headset, a mobile communication device, a smart phone, a cellular phone, a laptop computer, a computer, a tablet, a personal digital assistant, a display device, a television, a gaming console, a music player, a radio, a digital video player, a digital video disc (DVD) player, a tuner, a camera, a navigation device, a vehicle, a component of a vehicle, or any combination thereof.

In an illustrative implementation, the memory 632 includes or stores the instructions 668 (e.g., executable instructions), such as computer-readable instructions or processor-readable instructions. For example, the memory 632 may include or correspond to a non-transitory computer readable medium storing the instructions 668. The instructions 668 may include one or more instructions that are executable by a computer, such as the processor 610. The instructions 668 may cause the processor 610 to perform the method 500 of FIG. 5.

In a particular implementation, the instructions 668, when executed by the processor 610, may cause the processor 610 to initialize voltages of a first node and a second node of an MRAM cell to a substantially equal voltage during an initialization phase. For example, the processor 610 may provide one or more signals (e.g., an initialization signal, an equalization signal, an address (decodable to select a wordline), etc.) to the MRAM cell 101 to cause voltages of two nodes of the MRAM cell 101 to be initialized to a substantially equal voltage. The MRAM cell 101 may include a pair of cross-coupled inverters, a first MTJ element, and a second MTJ element. A first inverter of the pair of cross-coupled inverters may include a first transistor coupled to the first node and a second transistor coupled to the first node and to the first MTJ element. A second inverter of the pair of cross-coupled inverters may include a third transistor coupled to the second node and a fourth transistor coupled to the second node and to the second MTJ element. The instructions 668, when executed by the processor 610, may further cause the processor 610 to initiate storage of a PUF output bit at the MRAM cell 101 during a PUF content generation phase. For example, the processor 610 may provide one or more signals (e.g., an enable signal) to the MRAM cell 101 to cause discharge of initial voltages of the two nodes, thereby causing storage of a PUF output bit at the MRAM cell 101. In a particular implementation, the instructions 668, when executed by the processor 610, may further cause the processor 610 to assert an enable signal during the PUF content generation phase. A fifth transistor (e.g., the fifth transistor 110 of FIG. 1) may selectively couple the first MTJ element and the second MTJ element to ground in response to the enable signal.

In conjunction with the described aspects, an apparatus includes means for generating a physically unclonable function (PUF) output bit based on a resistance comparison. The means for generating the PUF output bit may include or correspond to the MRAM cell 101 of FIGS. 1, 3, and 6, the MRAM cell 401 of FIG. 4, the processor 610 of FIG. 6, one or more other structures or circuits configured to generate a PUF output bit based on a resistance comparison, or any combination thereof.

The means for generating the PUF output bit includes first means for inverting cross-coupled to second means for inverting, the first means for inverting having an output at a first node and the second means for inverting having an output at a second node. The first means for inverting may include or correspond to the first transistor 102 and the second transistor 104 of FIG. 1, one or more other structures or circuits configured to invert an input, or any combination thereof. The second means for inverting may include or correspond to the third transistor 106 and the fourth transistor 108 of FIG. 1, one or more other structures or circuits configured to invert an input, or any combination thereof. The means for generating the PUF output bit also include first resistive means coupled to the first means for inverting and second resistive means coupled to the second means for inverting. The first resistive means may include or correspond to the first MTJ element 120 of FIG. 1, one or more other structures or circuits configured to provide a programmable resistance, or any combination thereof. The second resistive means may include or correspond to the second MTJ element 122 of FIG. 1, one or more other structures or circuits configured to provide a programmable resistance, or any combination thereof.

The apparatus further includes means for equalizing voltages of the first node and the second node in response to an initialization signal, the means for equalizing coupled to the means for generating the PUF output bit. The means for equalizing voltages may include or correspond to the voltage initialization circuit 130 of FIGS. 1, 3, and 4, the processor 610 of FIG. 6, one or more other structures or circuits configured to equalize voltages of the first node and the second node in response to an initialization signal, or any combination thereof.

In a particular implementation, the means for generating the PUF output bit include means for selectively conducting current coupled to the first resistive means and to the second resistive means. The means for selectively conducting current may include or correspond to the fifth transistor 110, one or more other structures or circuits configured to selectively conduct current, or any combination thereof.

In another particular implementation, the means for equalizing voltages includes first means for selectively conducting current coupled to a voltage source and to a third node, second means for selectively conducting current coupled to the voltage source and to a fourth node, third means for selectively conducting current coupled to the voltage source and to the third node, and fourth means for selectively conducting current coupled to the voltage source and to the fourth node. An input of the third means for selectively conducting current may be coupled to the fourth node and an input of the fourth means for selectively conducting current may be coupled to the third node. The first means for selectively conducting current, the second means for selectively conducting current, the third means for selectively conducting current, and the fourth means for selectively conduction current may include or correspond to the seventh transistor 132, the eighth transistor 136, the ninth transistor 134, and the tenth transistor 138 of FIG. 1 (respectively), one or more other structures or circuits configured to selectively conduct current, or any combination thereof.

One or more of the disclosed aspects may be implemented in a system or an apparatus, such as the device 600, that may include a communications device, a fixed location data unit, a mobile location data unit, a mobile phone, a cellular phone, a satellite phone, a computer, a tablet, a portable computer, a display device, a media player, or a desktop computer. Alternatively or additionally, the device 600 may include a set top box, an entertainment unit, a navigation device, a personal digital assistant (PDA), a monitor, a computer monitor, a television, a tuner, a radio, a satellite radio, a music player, a digital music player, a portable music player, a video player, a digital video player, a digital video disc (DVD) player, a portable digital video player, a satellite, a vehicle, a component integrated within a vehicle, any other device that includes a processor or that stores or retrieves data or computer instructions, or a combination thereof. As another illustrative, non-limiting example, the system or the apparatus may include remote units, such as hand-held personal communication systems (PCS) units, portable data units such as global positioning system (GPS) enabled devices, meter reading equipment, or any other device that includes a processor or that stores or retrieves data or computer instructions, or any combination thereof.

Although one or more of FIGS. 1-6 may illustrate systems, apparatuses, and/or methods according to the teachings of the disclosure, the disclosure is not limited to these illustrated systems, apparatuses, and/or methods. One or more functions or components of any of FIGS. 1-6 as illustrated or described herein may be combined with one or more other portions of another of FIGS. 1-6. Accordingly, no single implementation described herein should be construed as limiting and implementations of the disclosure may be suitably combined without departing form the teachings of the disclosure. As an example, the method 500 of FIG. 5 may be performed by the processor 610 of FIG. 6. Additionally, one or more operations described with reference to FIG. 5 may be optional, may be performed at least partially concurrently, and/or may be performed in a different order than shown or described.

Those of skill would further appreciate that the various illustrative logical blocks, configurations, modules, circuits, and algorithm steps described in connection with the implementations disclosed herein may be implemented as electronic hardware, computer software executed by a processor, or combinations of both. Various illustrative components, blocks, configurations, modules, circuits, and steps have been described above generally in terms of their functionality. Whether such functionality is implemented as hardware or processor executable instructions depends upon the particular application and design constraints imposed on the overall system. Skilled artisans may implement the described functionality in varying ways for each particular application, but such implementation decisions should not be interpreted as causing a departure from the scope of the present disclosure.

The steps of a method or algorithm described in connection with the disclosure herein may be implemented directly in hardware, in a software module executed by a processor, or in a combination of the two. A software module may reside in random access memory (RAM), flash memory, read-only memory (ROM), programmable read-only memory (PROM), erasable programmable read-only memory (EPROM), electrically erasable programmable read-only memory (EEPROM), registers, hard disk, a removable disk, a compact disc read-only memory (CD-ROM), or any other form of non-transient storage medium known in the art. An exemplary storage medium is coupled to the processor such that the processor can read information from, and write information to, the storage medium. In the alternative, the storage medium may be integral to the processor. The processor and the storage medium may reside in an application-specific integrated circuit (ASIC). The ASIC may reside in a computing device or a user terminal. In the alternative, the processor and the storage medium may reside as discrete components in a computing device or user terminal.

The previous description is provided to enable a person skilled in the art to make or use the disclosed implementations. Various modifications to these implementations will be readily apparent to those skilled in the art, and the principles defined herein may be applied to other implementations without departing from the scope of the disclosure. Thus, the present disclosure is not intended to be limited to the implementations shown herein but is to be accorded the widest scope possible consistent with the principles and novel features as defined by the following claims.

What is claimed is:

1. An apparatus comprising:
    a magnetic random access memory (MRAM) cell comprising:
        a pair of cross-coupled inverters including a first inverter and a second inverter, the first inverter including a first transistor coupled to a first node and a second transistor coupled to the first node, the second inverter including a third transistor coupled to a second node and a fourth transistor coupled to the second node;
        a first magnetic tunnel junction (MTJ) element coupled to the second transistor; and
        a second MTJ element coupled to the fourth transistor; and
    a voltage initialization circuit coupled to the MRAM cell, the voltage initialization circuit configured to substantially equalize voltages of the first node and the second node in response to an initialization signal.

2. The apparatus of claim 1, wherein the MRAM cell is configured to output a physically unclonable function (PUF)

output bit based on a resistance of the first MTJ element and a resistance of the second MTJ element.

3. The apparatus of claim 2, further comprising an MRAM array that includes the MRAM cell, wherein the MRAM array is configured to output a PUF output including the PUF output bit.

4. The apparatus of claim 2, wherein the MRAM cell is configured to output the PUF output bit independent of a clock signal.

5. The apparatus of claim 1, wherein the MRAM cell further comprises a fifth transistor coupled to the first MTJ element and to the second MTJ element, wherein the fifth transistor is configured to selectively couple the first MTJ element and the second MTJ element to ground based on an enable signal.

6. The apparatus of claim 5, wherein the fifth transistor comprises an n-channel metal-oxide-semiconductor (NMOS) transistor.

7. The apparatus of claim 1, further comprising a sixth transistor coupled to the first node and to the second node, the sixth transistor configured to selectively short the first node to the second node based on an equalization signal.

8. The apparatus of claim 7, wherein the first node is coupled to a gate of the third transistor and to a gate of the fourth transistor, and wherein the second node is coupled to a gate of the first transistor and to a gate of the second transistor.

9. The apparatus of claim 7, wherein the sixth transistor comprises a p-channel metal-oxide-semiconductor (PMOS) transistor.

10. The apparatus of claim 7, wherein the sixth transistor comprises an n-channel metal-oxide-semiconductor (NMOS) transistor.

11. The apparatus of claim 1, wherein the voltage initialization circuit comprises:

a seventh transistor coupled to a voltage source and to a third node;
an eighth transistor coupled to the voltage source and to a fourth node, wherein the seventh transistor and the eighth transistor are configured to be selectively enabled based on the initialization signal;
a ninth transistor coupled to the voltage source and to the third node, wherein a gate of the ninth transistor is coupled to the fourth node; and
a tenth transistor coupled to the voltage source and to the fourth node, wherein a gate of the tenth transistor is coupled to the third node.

12. The apparatus of claim 11, wherein the MRAM cell further comprises:

a first access transistor coupled to the first node and to a first bit line, wherein the third node is coupled to the first bit line; and
a second access transistor coupled to the second node and to a second bit line, wherein the fourth node is coupled to the second bit line.

13. The apparatus of claim 1, wherein the first MTJ element and the second MTJ element comprise perpendicular MTJ elements.

14. The apparatus of claim 1, wherein an output of the first inverter is coupled to an input of the second inverter, and wherein an output of the second inverter is coupled to an input of the first inverter.

15. The apparatus of claim 1, wherein the first node is coupled to a gate of the third transistor and a gate of the fourth transistor, wherein the second node is coupled to a gate of the first transistor and a gate of the second transistor, and wherein the first and third transistors are a first transistor type and the second and fourth transistors are a second transistor type.

* * * * *